United States Patent
Kim et al.

(10) Patent No.: US 10,366,740 B1
(45) Date of Patent: **\*Jul. 30, 2019**

(54) APPARATUSES HAVING MEMORY STRINGS COMPARED TO ONE ANOTHER THROUGH A SENSE AMPLIFIER

(71) Applicant: Micron Technology, Inc., Boise, ID (US)

(72) Inventors: Tae H. Kim, Boise, ID (US); Sangmin Hwang, Boise, ID (US); Si-Woo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/234,319

(22) Filed: Dec. 27, 2018

Related U.S. Application Data

(63) Continuation of application No. 15/900,403, filed on Feb. 20, 2018.

(51) Int. Cl.
G11C 11/4091 (2006.01)
G11C 11/22 (2006.01)
G11C 11/4097 (2006.01)

(52) U.S. Cl.
CPC ........ *G11C 11/4091* (2013.01); *G11C 11/221* (2013.01); *G11C 11/2273* (2013.01); *G11C 11/4097* (2013.01)

(58) Field of Classification Search
CPC .............. G11C 11/4091; G11C 11/221; G11C 11/2273; G11C 11/4097
USPC ......................................................... 365/145
See application file for complete search history.

(56) References Cited

U.S. PATENT DOCUMENTS

| | | | | |
|---|---|---|---|---|
| 5,604,697 A | * | 2/1997 | Takahashi | G11C 7/10 257/E27.081 |
| 5,874,757 A | * | 2/1999 | Chao | H01L 27/10829 257/301 |
| 6,115,309 A | * | 9/2000 | Coleman, Jr. | G11C 7/065 365/189.11 |
| 6,292,417 B1 | * | 9/2001 | Seyyedy | G11C 7/1048 365/202 |
| 6,327,200 B1 | * | 12/2001 | Casper | G11C 11/4074 365/149 |

(Continued)

FOREIGN PATENT DOCUMENTS

WO          WO          1/2019
PCT/US2018/049351

*Primary Examiner* — Sung Il Cho
(74) *Attorney, Agent, or Firm* — Wells St. John P.S.

(57) ABSTRACT

Some embodiments include an apparatus having first and second comparative bitlines extending horizontally and coupled with a sense amplifier. First memory cell structures are coupled with the first comparative bitline. Each of the first memory cell structures has a first transistor associated with a first capacitor. Second memory cell structures are coupled with the second comparative bitline. Each of the second memory cell structures has a second transistor associated with a second capacitor. Each of the first capacitors has a container-shaped first node and is vertically offset from an associated first sister capacitor which is a mirror image of its associated first capacitor along a horizontal plane. Each of the second capacitors has a container-shaped first node and is vertically offset from an associated second sister capacitor which is a mirror image of its associated second capacitor along the horizontal plane.

1 Claim, 8 Drawing Sheets

(56) References Cited

U.S. PATENT DOCUMENTS

| | | | | |
|---|---|---|---|---|
| 6,459,634 B1* | 10/2002 | Sher | | G11C 29/18 365/185.2 |
| 6,495,428 B1* | 12/2002 | Rhodes | | H01L 28/75 438/396 |
| 6,961,271 B2* | 11/2005 | Jeon | | G11C 11/404 365/190 |
| 9,552,869 B1* | 1/2017 | Cordero | | G11C 7/062 |
| 2002/0022320 A1* | 2/2002 | DeBoer | | H01L 28/84 438/255 |
| 2002/0025650 A1* | 2/2002 | Thakur | | G11C 11/404 438/398 |
| 2002/0141228 A1* | 10/2002 | Fujino | | G11C 7/18 365/149 |
| 2004/0040494 A1* | 3/2004 | Vaartstra | | C23C 16/409 117/104 |
| 2004/0109342 A1* | 6/2004 | Fujino | | G11C 11/005 365/149 |
| 2004/0174733 A1 | 9/2004 | Kirihata et al. | | |
| 2005/0199931 A1 | 9/2005 | Lin | | |
| 2006/0261441 A1* | 11/2006 | Marsh | | H01L 21/76841 257/532 |
| 2008/0316839 A1* | 12/2008 | Kajigaya | | G11C 7/02 365/189.11 |
| 2010/0110755 A1 | 5/2010 | Hashimoto et al. | | |
| 2011/0241166 A1* | 10/2011 | Chumakov | | H01L 21/76865 257/532 |
| 2014/0367827 A1* | 12/2014 | Lee | | H01L 23/5223 257/532 |
| 2015/0149717 A1* | 5/2015 | Riho | | G11C 11/40622 711/106 |
| 2015/0311217 A1* | 10/2015 | Chavan | | H01L 27/11507 257/295 |
| 2016/0358640 A1* | 12/2016 | Brederlow | | G06F 8/65 |
| 2018/0061834 A1 | 3/2018 | Derner et al. | | |
| 2018/0061836 A1 | 3/2018 | Mathew et al. | | |
| 2018/0158494 A1* | 6/2018 | Park | | G11C 7/1027 |
| 2018/0218765 A1 | 8/2018 | Derner et al. | | |

* cited by examiner

APPARATUSES HAVING MEMORY STRINGS COMPARED TO ONE ANOTHER THROUGH A SENSE AMPLIFIER

RELATED PATENT DATA

This patent resulted from a continuation of U.S. patent application Ser. No. 15/900,403, which was filed Feb. 20, 2018, and which is hereby incorporated herein by reference.

TECHNICAL FIELD

Apparatuses having memory strings which are compared to one another through a sense amplifier.

BACKGROUND

Memory is utilized in modern computing architectures for storing data. One type of memory is Dynamic Random Access Memory (DRAM). DRAM may provide advantages of structural simplicity, low cost and high speed in comparison to alternative types of memory.

DRAM may utilize memory cells which have one capacitor in combination with one transistor (so-called 1T-1C memory cells), with the capacitor being coupled with a source/drain region of the transistor. An example 1T-1C memory cell 1000 is shown in FIG. 1, with the transistor labeled T and the capacitor labeled C. The capacitor has one node coupled with a source/drain region of the transistor, and has another node coupled with a common plate, CP. The common plate may be coupled with any suitable voltage, such as a voltage within a range of from greater than or equal to ground to less than or equal to VCC (i.e., ground≤CP≤VCC). In some applications, the common plate is at a voltage of about one-half VCC (i.e., about VCC/2). The transistor has a gate coupled to a wordline WL (i.e., access line), and has a source/drain region coupled to a bitline BL (i.e., digit line or sense line). In operation, an electrical field generated by voltage along the wordline may gatedly couple the bitline to the capacitor during read/write operations.

Another prior art memory cell configuration utilizes two capacitors in combination with two transistors. Such configuration may be referred to as a 2T-2C memory cell. A 2T-2C memory cell 1010 is schematically illustrated in FIG. 2. The two transistors of the memory cell are labeled T1 and T2, and may be referred to as first and second transistors, respectively. The two capacitors are labeled C1 and C2, and may be referred to as first and second capacitors, respectively.

A source/drain region of the first transistor T1 connects with a node of the first capacitor C1, and the other source/drain region of the first transistor T1 connects with a first comparative bitline BL-T. A gate of the first transistor T1 connects with a wordline WL. A source/drain region of the second transistor T2 connects with a node of the second capacitor C2, and the other source/drain region of the second transistor T2 connects with a second comparative bitline BL-C. A gate of the second transistor T2 connects with the wordline WL. Each of the first and second capacitors C1 and C2 has a node electrically coupled with a common plate CP.

The comparative bitlines BL-T and BL-C extend to a sense amplifier SA which compares electrical properties (e.g., voltage) of the two to ascertain a memory state of memory cell 1010. The bitline BL-T may be referred to as a true bitline, and the bitline BL-C may be referred to as a complementary bitline. The terms "true" and "complementary" are arbitrary, and merely indicate that the bitline values of BL-T and BL-C are to be compared to one another.

It would be desirable to develop architectures which incorporate memory into highly-integrated arrangements in order to conserve valuable real estate of a semiconductor chip.

DETAILED DESCRIPTION OF THE ILLUSTRATED EMBODIMENTS

Some embodiments include arrangements of memory cell strings which are to be compared with one another through a sense amplifier. The memory cell strings may include memory cell structures having at least one transistor and at least one capacitor. In some example embodiments, the memory cell structures may be 1T-1C memory cells. In some example embodiments, the memory cell structures may be 2T-2C cells. The arrangements may be highly integrated by having various components vertically-stacked one atop another. Example configurations are described with reference to FIGS. 3-9.

Figure 2:
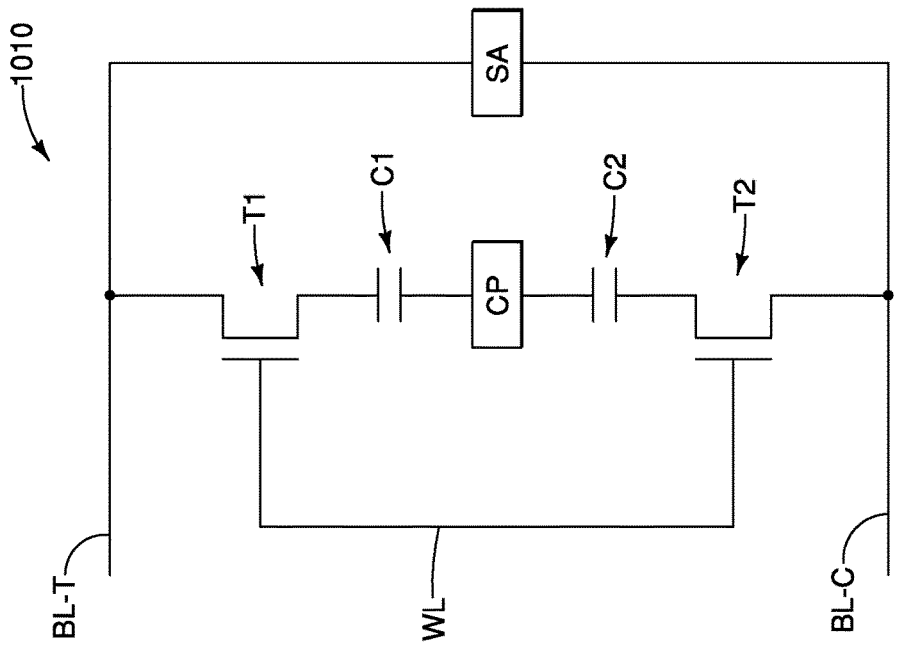
FIG. 2 is a schematic diagram of a prior art memory cell having 2 transistors and 2 capacitors.
Figure 1:
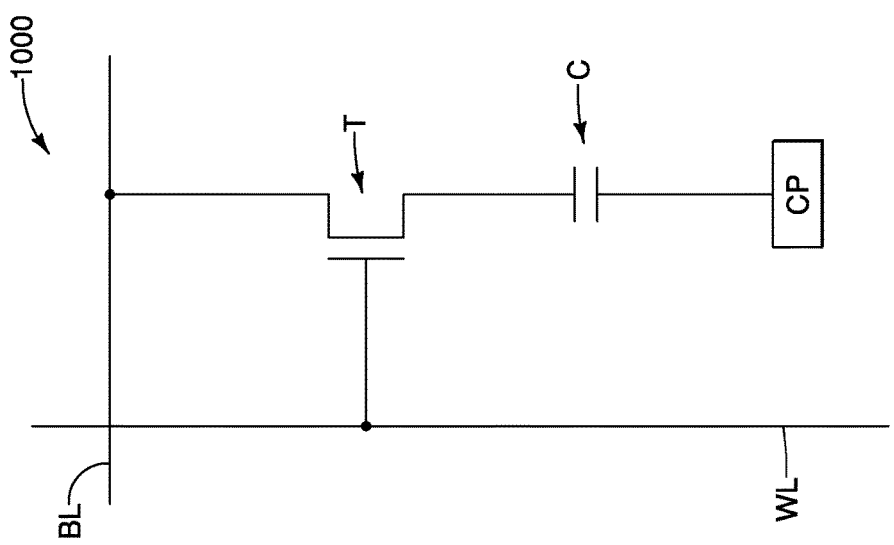
FIG. 1 is a schematic diagram of a prior art memory cell having 1 transistor and 1 capacitor.
Figure 3:
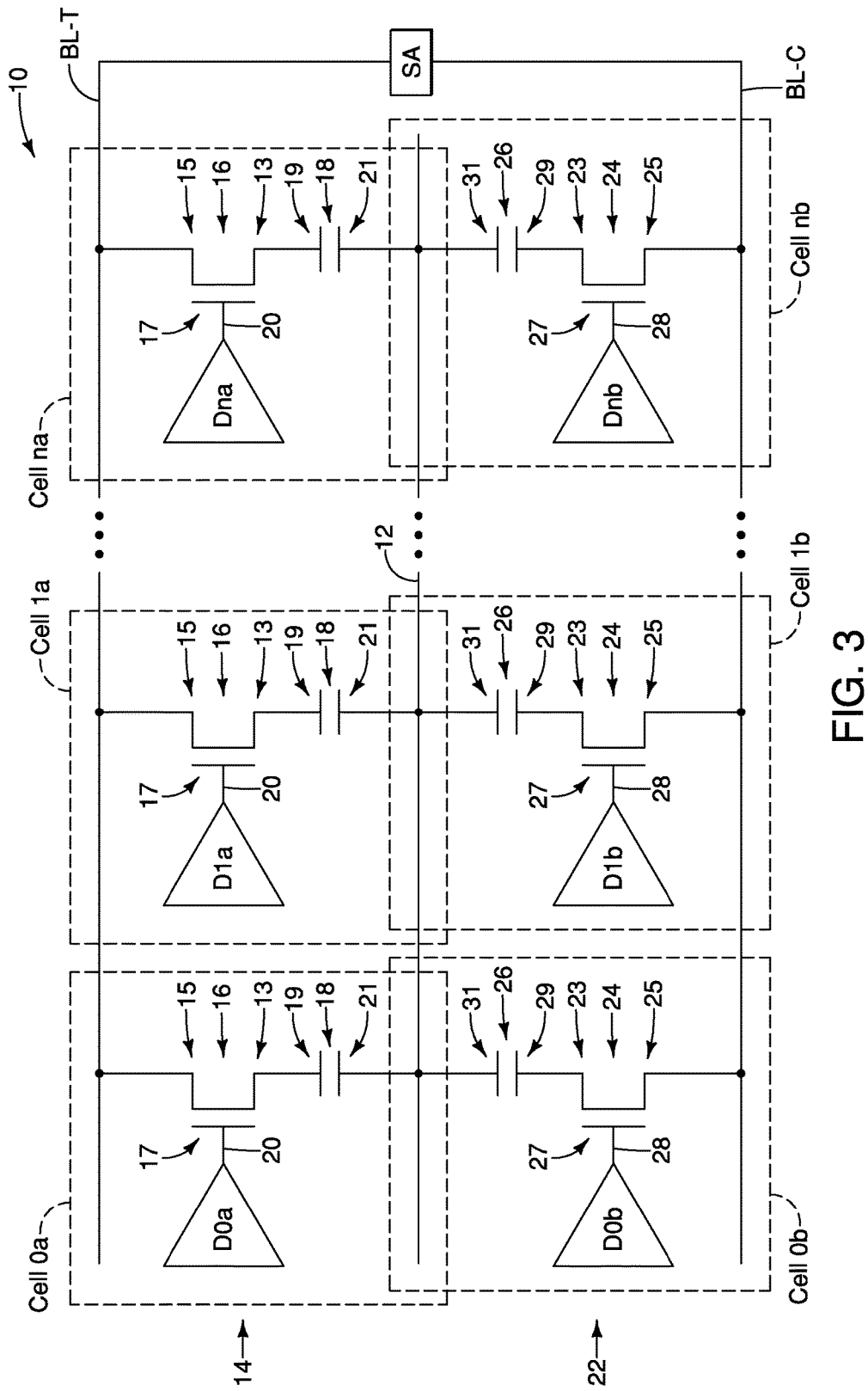
FIG. 3 is a schematic diagram of a region of an example apparatus.

Referring to FIG. 3, an example apparatus (i.e., construction, assembly, etc.) 10 includes a first comparative bitline BL-T which extends horizontally, and which is coupled with a sense amplifier SA. The apparatus 10 also includes a second comparative bitline BL-C which extend horizontally, and which is also coupled with the sense amplifier SA.

A common plate 12 is vertically between the first and second comparative bitlines, and extends horizontally.

First memory cell structures are between the first comparative bitline BL-T and the common plate 12, with such first memory cell structures being labeled as Cells 0a . . . na; where "n" is an integer. The first memory cell structures are horizontally spaced from one another, and are together arranged in a first memory cell string 14. The total number of the first memory cell structures within the memory cell string 14 may be any suitable number; and in some embodiments may be 64 memory cell structures, 128 memory cell structures, 256 memory cell structures, 512 memory cell structures, 1024 memory cell structures etc. Accordingly, the integer "n" of Cells 0a . . . na may be, for example, 63, 127, 255, 511, 1023, etc.

Each of the first memory cell structures (Cells 0a . . . na) comprises a first transistor 16 associated with a first capacitor 18. The first transistors 16 are proximate the first comparative bitline BL-T, and the first capacitors 18 are proximate the common plate 12.

Each of the first transistors 16 comprises a gate 17, and a pair of source/drain regions 13 and 15. The source/drain regions 13 and 15 may be referred to as first and second source/drain regions, respectively. The second source/drain regions 15 are coupled with the first comparative bitline BL-T.

Each of the first capacitors 18 has a first node 19 and a second node 21. The first node 19 of each capacitor 18 is coupled with the first source/drain region 13 of the transistor 16 associated with the capacitor 18, and the second note 21 is coupled with the common plate 12.

The gates 17 of the transistors 16 are coupled with wordlines 20 which extend to wordline drivers D0a . . . Dna. The first memory cells (Cells 0a . . . na) are 1T-1C memory cells, and each of the drivers D0a . . . Dna is independently controlled relative to the other drivers D0a . . . Dna.

Second memory cell structures are between the second comparative bitline BL-C and the common plate 12, with such second memory cell structures being labeled as Cells 0b . . . nb. The second memory cell structures are horizontally spaced from one another, and are together arranged in a second memory cell string 22.

Each of the second memory cell structures (Cells 0b . . . nb) comprises a second transistor 24 associated with a second capacitor 26. The second transistors 24 are proximate the second comparative bitline BL-C, and the second capacitors 26 are proximate the common plate 12.

Each of the second transistors 24 comprises a gate 27, and a pair of source/drain regions 23 and 25. The source/drain regions 23 and 25 may be referred to as first and second source/drain regions, respectively. The second source/drain regions 25 are coupled with the second comparative bitline BL-C.

Each of the second capacitors 26 has a first node 29 and a second node 31. The first node 29 of each capacitor 26 is coupled with the first source/drain region 23 of the transistor 24 associated with the capacitor 26, and the second note 31 is coupled with the common plate 12.

The gates 27 of the transistors 24 are coupled with wordlines 28 which extend to wordline drivers D0b . . . Dnb. The second memory cells (Cells 0b . . . nb) are 1T-1C memory cells, and each of the drivers D0b . . . Dnb is independently controlled relative to the other drivers D0b . . . Dnb.

The second memory cell string 22 is a complement to the first memory cell string 14, and such are configured to be compared to one another through the sense amplifier SA during memory operations (e.g., operations in which data is read from the illustrated memory cells of apparatus 10).

In some embodiments, the apparatus 10 may be considered to be an example of a folded architecture, with the second comparative bitline BL-C being arranged to be under the first comparative bitline BL-T. The architecture may be highly integrated. In some embodiments, the second memory cell structures 0b . . . nb may be directly under the first memory cell structures 0a . . . na; as is diagrammatically illustrated in the cross-sectional view of FIG. 4.

Figure 4:
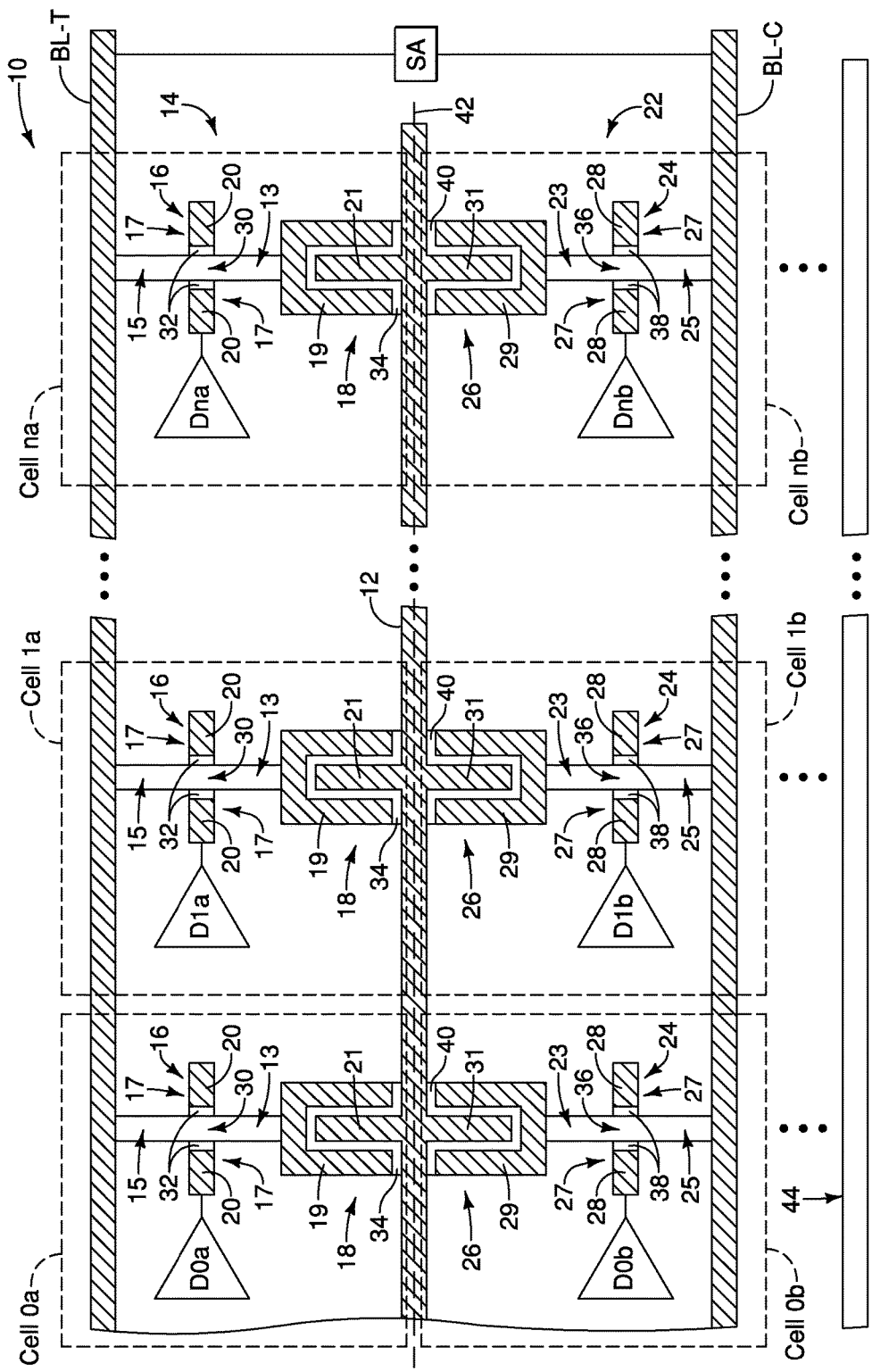
FIG. 4 is a diagrammatic cross-sectional view of an example arrangement of structures which may be utilized in the example apparatus of FIG. 3.

The apparatus 10 of FIG. 4 comprises the comparative bitlines BL-T and BL-C as conductive wiring extending along a horizontal direction. Such conductive wiring may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The common plate 12 is also conductive wiring extending along the horizontal direction. Such conductive wiring may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The first transistors 16 include the gates 17 extending around semiconductor material pedestals 30, with the gates 17 comprising conductive material in common with the wordlines 20. Such conductive material may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The gates 17 are spaced from the semiconductor material pedestals 30 by insulative material 32 (which may be referred to as gate dielectric material). The insulative material 32 may comprise any suitable composition or combination of compositions; and in some embodiments may comprise, consist essentially of, or consist of silicon dioxide.

The semiconductor material of the pedestals 30 may comprise any suitable composition or combination of compositions; and in some embodiments may comprise one or more of silicon, germanium, III/V semiconductor materials (e.g., gallium phosphide), semiconductor oxides, etc.

The source/drain regions 13 and 15 are formed within the semiconductor material of the pedestals 30. In some embodiments, the source/drain regions may be n-type regions associated with NMOS devices; and in other embodiments may be p-type regions associated with PMOS devices. Channel regions (not labeled) would be within the semiconductor material pedestals 30 along the gate dielectric material 32, and between the source/drain regions 13 and 15.

The capacitors 18 comprise the first nodes 19 configured as downwardly-opening container structures, and comprise the second nodes 21 extending upwardly into the downwardly-opening container structures. The nodes 19 and 21 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

Insulative material 34 (which may be called capacitor dielectric material) is between the first and second nodes 19 and 21. The insulative material 34 may comprise any suitable composition (e.g., non-ferroelectric material, ferroelectric material and magnetic material) or combination of compositions. In some embodiments, the insulative material 34 may comprise non-ferroelectric material; and may, for example, comprise, consist essentially of, or consist of one or more of silicon dioxide, silicon nitride, aluminum oxide, hafnium oxide, zirconium oxide, etc. In some embodiments, the insulative material 34 may comprise ferroelectric material. For instance, the insulative material 34 may comprise, consist essentially of, or consist of one or more materials selected from the group consisting of transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, niobium, strontium, and a rare earth element.

The second transistors 24 include the gates 27 extending around semiconductor material pedestals 36, with the gates 27 comprising conductive material in common with the wordlines 28. Such conductive material may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The gates 27 are spaced from the semiconductor material pedestals 36 by insulative material 38 (which may be referred to as gate dielectric material). The insulative material 38 may comprise any suitable composition or combination of compositions; and in some embodiments may comprise, consist essentially of, or consist of silicon dioxide.

The semiconductor material of the pedestals 36 may comprise any suitable composition or combination of compositions; and in some embodiments may comprise one or more of silicon, germanium, III/V semiconductor materials (e.g., gallium phosphide), semiconductor oxides, etc.

The source/drain regions 23 and 25 are formed within the semiconductor material of the pedestals 36. In some embodiments, the source/drain regions may be n-type regions associated with NMOS devices; and in other embodiments may be p-type regions associated with PMOS devices. Channel regions (not labeled) would be within the semiconductor material pedestals 36 along the gate dielectric material 38, and between the source/drain regions 23 and 25.

The capacitors 26 comprise the first nodes 29 configured as upwardly-opening container structures, and comprise the second nodes 31 extending downwardly into the upwardly-opening container structures. The nodes 29 and 31 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

Insulative material 40 (which may be referred to as capacitor dielectric material) is between the first and second nodes 29 and 31. The insulative material 40 may comprise any suitable composition (e.g., non-ferroelectric material, ferroelectric material and magnetic material) or combination of compositions. In some embodiments, the insulative material 40 may comprise non-ferroelectric material; and may, for example, comprise, consist essentially of, or consist of one or more of silicon dioxide, silicon nitride, aluminum oxide, hafnium oxide, zirconium oxide, etc. In some embodiments, the insulative material 40 may comprise ferroelectric material. For instance, the insulative material 40 may comprise, consist essentially of, or consist of one or more materials selected from the group consisting of transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, niobium, strontium, and a rare earth element.

In some embodiments, the memory cells of the second string 22 may comprise identical compositions as the memory cells of the first string 14, and may be mirror images of such memory cells reflected across a horizontal plane 42 extending along the center of the common plate 12. For instance, the Cell 0a may be a mirror image of the Cell 0b. In some embodiments, at least the second capacitors 26 of the second memory string 22 are mirror images of the first capacitors 18 reflected across the horizontal plane 42 along the center of the common plate 12. In such embodiments, each of the first capacitors 18 within the first memory cell string 14 may be considered to be vertically offset from a sister capacitor 26 within the second memory cell string 22. For instance, the capacitor 18 within Cell 0a is vertically offset from a sister capacitor 26 within Cell 0b. In the embodiment of FIG. 4, the sister capacitors are within a second memory cell string 22 which is a complement to the first memory cell string 14, with the first memory cell string 14 and its complement memory cell string 22 being compared through the sense amplifier SA.

FIG. 4 shows a base 44 under the comparative bitline BL-C. The base 44 may comprise semiconductor material; and may, for example, comprise, consist essentially of, or consist of monocrystalline silicon. The base 44 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 44 may correspond to a semiconductor substrate containing one or more materials associated with integrated circuit fabrication. Such materials may include, for example, one or more of refractory metal materials, barrier materials, diffusion materials, insulator materials, etc.

A gap is provided between the comparative bitline BL-C and base 44 to indicate that there may be other structures, components, etc., provided between the base 44 and the comparative bitline BL-C.

Figure 5:
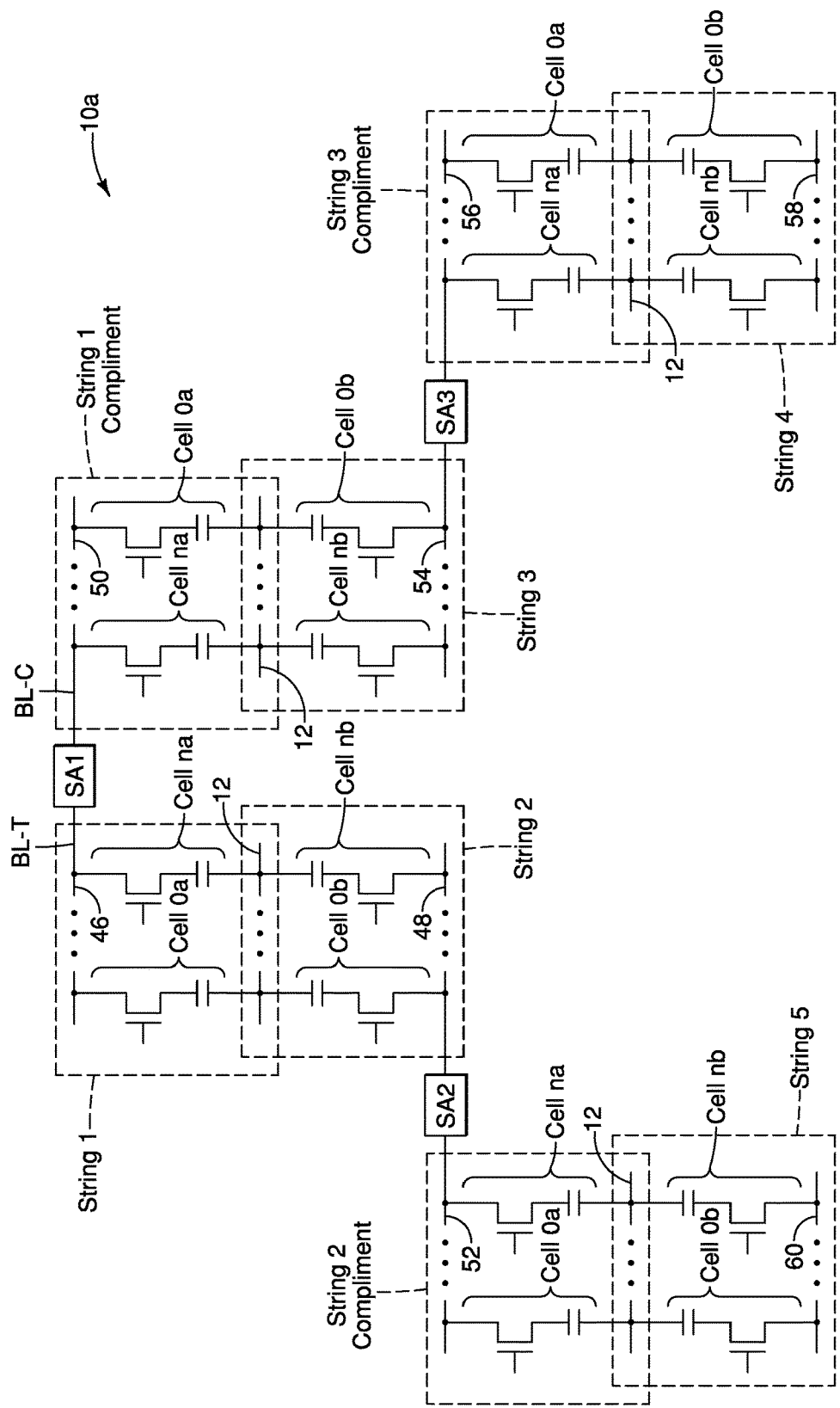
FIG. 5 is a schematic diagram of a region of an example apparatus.

FIG. 5 shows another example apparatus 10a. The apparatus 10a has the comparative bitline BL-T extending to a first sense amplifier SA1. The comparative bitline BL-C also extends to the first sense amplifier SA1, and is horizontally offset relative to the comparative bitline BL-T. In some embodiments, the comparative bitline BL-T may be referred to as a first comparative bitline 46. Such comparative bitline is over a second comparative bitline 48. The second comparative bitline extends horizontally to a second sense amplifier SA2. The comparative bitline BL-C may be referred to as a third comparative bitline 50 which is coupled with the first sense amplifier SA1. A fourth comparative bitline 52 is horizontally offset relative to the second comparative bitline 48, and is coupled with the second sense amplifier SA2. A fifth comparative bitline 54 is vertically displaced relative to the third comparative bitline 50, and extends to a third sense amplifier SA3. A sixth comparative bitline 56 is horizontally displaced relative to the fifth comparative bitline 54, is also coupled with the third sense amplifier SA3. A seventh comparative bitline 58 is vertically displaced relative to the second comparative bitline 56, and an eighth comparative bitline 60 is vertically displaced relative to the fourth comparative bitline 52.

The vertically-displaced bitlines 46/48 together form a first pair of vertically-displaced bitlines having a common plate 12 between them. Similarly, the bitlines 50/54 together form a second pair of vertically-displaced bitlines having a common plate 12 between them, the bitlines 52/60 together form a third pair of vertically-displaced bitlines having a common plate 12 between them, and the bitlines 56/58 together form a fourth pair of vertically-displaced bitlines having a common plate 12 between them.

Between each pair of vertically-displaced bitlines is a top memory cell string having memory cell structures labeled as Cells 0a . . . na, and a bottom memory cell string of memory cell structures labeled as Cells 0b . . . nb; with each of the memory cell structures comprising a capacitor and a transistor in a configuration analogous to that described above with reference to FIG. 3. The transistors and capacitors are not separately labeled in FIG. 5 in order to simplify the drawing, but it is to be understood that such capacitors and transistors may have configurations analogous to those discussed above with reference to FIG. 3.

Wordline drivers are not shown in FIG. 5 in order to simplify the drawing; but it is to be understood that each of the transistors of the memory cells of FIG. 5 may have its gate coupled with a wordline driver in a configuration analogous to that described above with reference to FIG. 3 (with example wordline drivers of FIG. 3 being D0a . . . Dna and D0b . . . Dnb).

The Cells 0a . . . na along the first comparative bitline 46 may be referred to as first memory cell structures which are horizontally spaced from one another, and which are together arranged in a first memory cell string labeled as String 1. Similarly, the Cells 0b . . . nb along the second comparative bitline 48 may be referred to as second memory cell structures which are together arranged in a second memory cell string labeled as String 2.

The Cells 0a . . . na along the third comparative bitline 50 may be referred to as third memory cell structures which are together arranged in a complement to the first memory cell string, and which is labeled as String 1 complement; with String 1 and its complement being configured to be compared to another through the first sense amplifier SA1.

The Cells 0a . . . na along the fourth comparative bitline 52 may be referred to as fourth memory cell structures which are together arranged in a complement to the second memory cell string, and which is labeled as String 2 complement; with String 2 and its complement being configured to be compared to another through the second sense amplifier SA2.

The Cells 0b . . . nb along the fifth comparative bitline 54 are arranged in a memory cell string (String 3), and the Cells 0a . . . na along the sixth comparative bitline 56 are arranged in a complement to such memory cell string (labeled as String 3 complement); with String 3 and its complement being configured to be compared to another through the third sense amplifier SA3.

The Cells 0b . . . nb along the seventh comparative bitline 58 are configured as a fourth memory cell string (String 4) which may be compared with a complement to the fourth string (not shown in FIG. 5); and the Cells 0b . . . nb along the eighth comparative bitline 60 are configured as a fifth memory cell string (String 5) which may be compared with a complement to the fifth string (not shown in FIG. 5).

Figure 6:
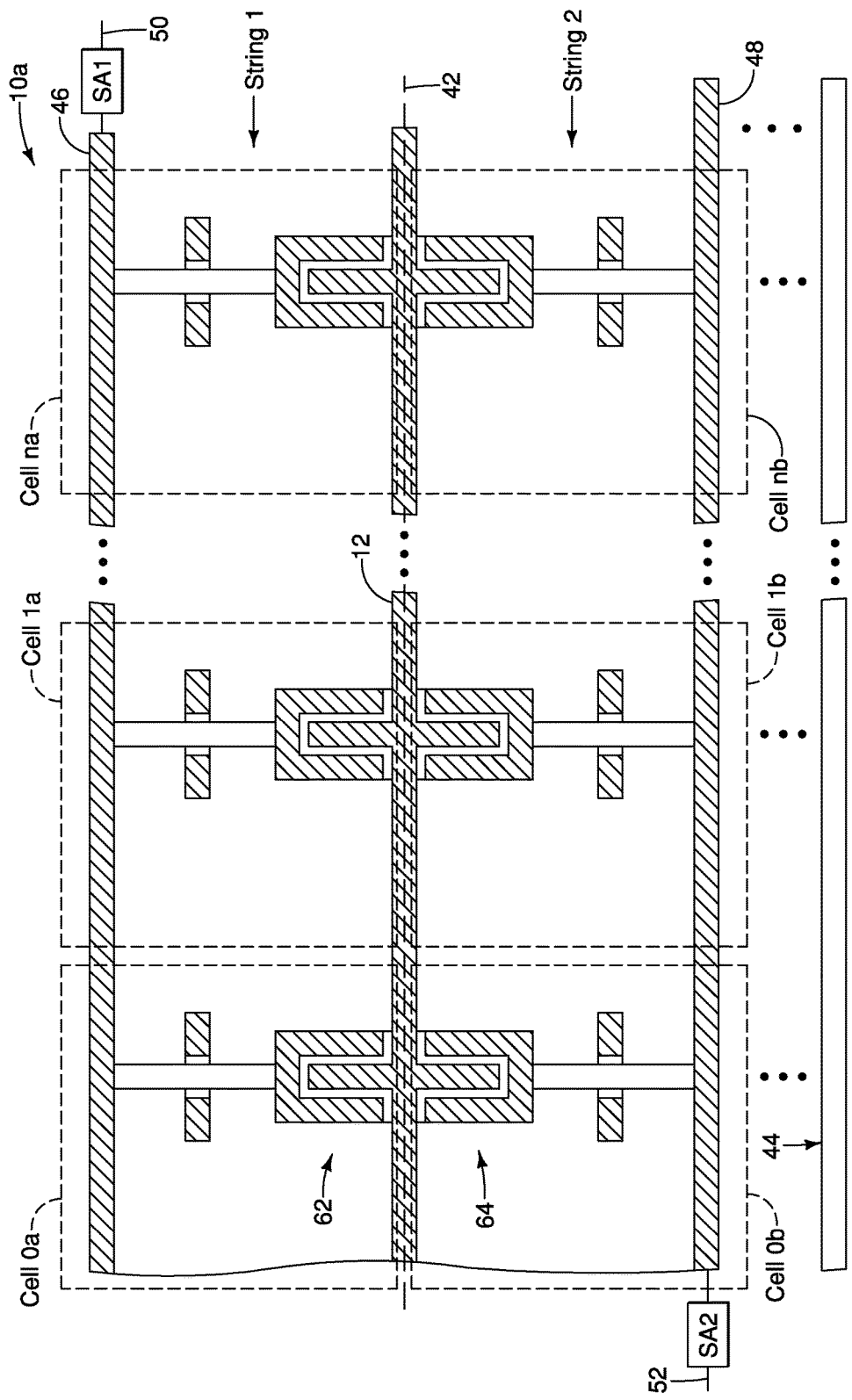
FIG. 6 is a diagrammatic cross-sectional view of an example arrangement of structures which may be utilized in the example apparatus of FIG. 5.

In some embodiments, the apparatus 10a may be considered to be an example of an open architecture, with the second comparative bitline BL-C being arranged to be horizontally offset relative to the first comparative bitline BL-T with which it is compared. The open architecture may be highly integrated in a manner analogous to that described above with reference to the folded architecture of FIG. 4. For instance, FIG. 6 shows a region of the apparatus 10a comprising the paired vertically-stacked bitlines 46/48.

The illustrated region of apparatus 10a is identical to the region of the apparatus 10 shown in FIG. 4 in many respects. The various regions of the transistors and capacitors of FIG. 6 are not labeled, but it is to be understood that such regions may be identical to analogous regions shown in the embodiment of FIG. 4. The apparatus 10a of FIG. 6 differs from the apparatus 10 of FIG. 4 in that the comparative bitlines 46 and 48 of FIG. 6 are not coupled to the same sense amplifier. Instead, the comparative bitline 46 is coupled to the first sense amplifier SA1, while the comparative bitline 48 is coupled to the second sense amplifier SA2. Accordingly, the memory cell string associated with the lower comparative bitline 48 (String 2) is not a complement to the memory cell string associate with the upper comparative bitline 46 (String 1) in that such strings are not compared to one another through a sense amplifier. Regardless, capacitors within the lower memory cell string (String 2) may be considered to be sister capacitors relative to capacitors in the upper memory cell string (String 1) in that they are mirror images of the capacitors in the upper memory cell string along the plane 42. For instance, a capacitor within the memory cell 0a is labeled as 62, and a capacitor within the memory cell 0b is labeled as 64; and such capacitors may be referred to as being sister capacitors in that they may be mirror images of one another across the plane 42.

The upper memory cell string labeled as String 1 may be considered to be paired with the lower memory cell string labeled as String 2, in that capacitors along the upper memory cell string share the common plate 12 with the capacitors along the lower memory cell string. Accordingly, the vertically-displaced bitlines 46/48 may be considered to be arranged in a paired structure. Analogously, the other vertically-displaced bitlines 50/54, 56/58 and 52/60 of FIG. 5 may be considered to be arranged in similar paired structures. The memory cells within such paired structures may comprise sister capacitors of the type described with reference to FIG. 6 as the sister capacitors 62/64.

The memory cell configurations described above have only a single transistor and a single capacitor (i.e., are 1T-1C memory cell configurations). In other embodiments, analogous arrangements to those described above may be utilized with 2T-2C memory cell configurations.

Figure 7:
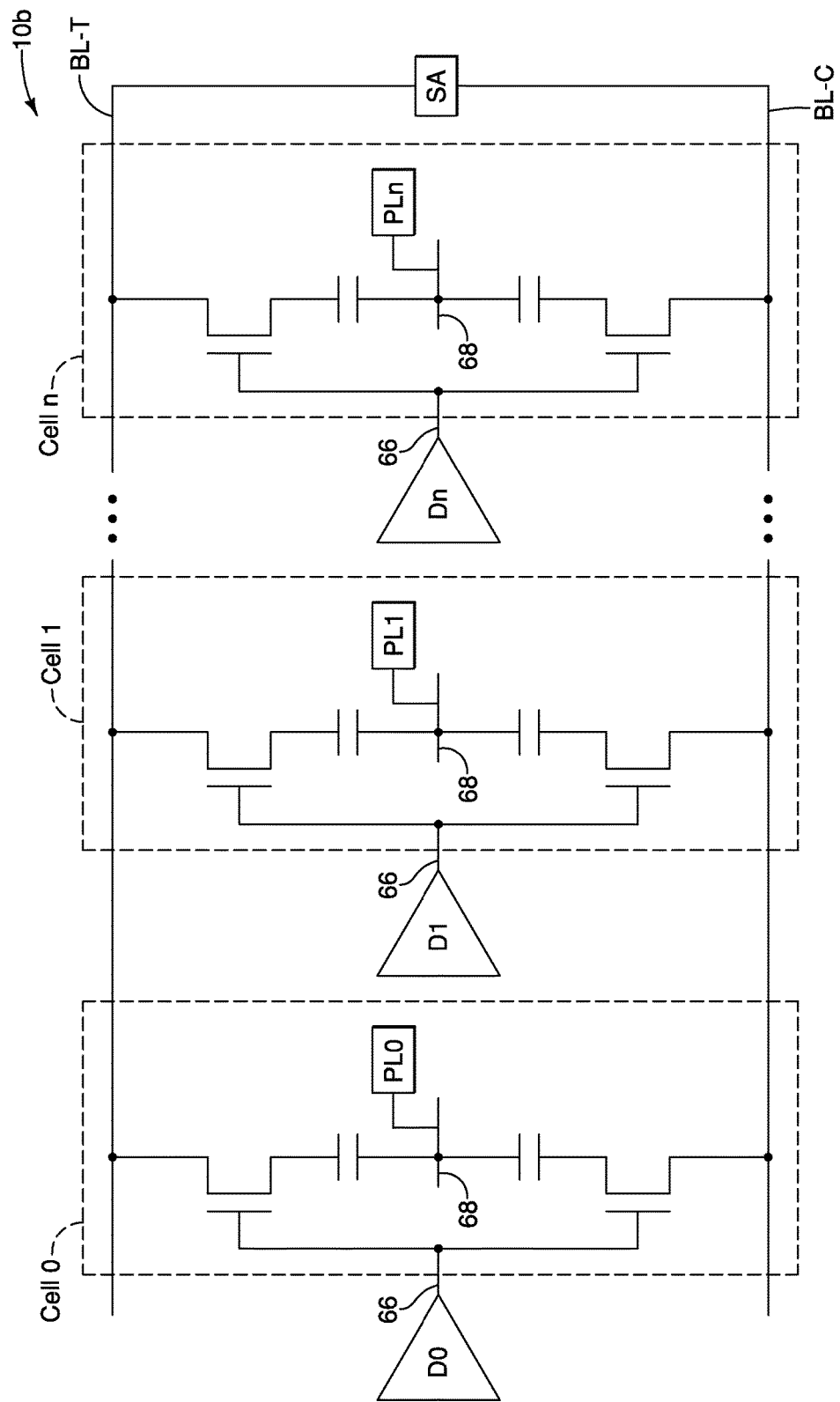
FIG. 7 is a schematic diagram of a region of an example apparatus.

FIG. 7 shows an apparatus 10b having a folded configuration analogous to that described above with reference to FIG. 3, but in which the gates of vertically-stacked transistors are coupled with one another to thereby form 2T-2C memory cell structures of Cells 0 . . . n. The gates of the transistors are coupled with wordlines 66 which extend to wordline drivers D0 . . . Dn.

The common plate 12 of the folded configuration of FIG. 3 is replaced with a plurality of plates 68 which are coupled with plate drivers PL0 . . . PLn. Each of the plate drivers may be independently operated relative to all of the others. In some embodiments, the capacitors of the memory cell structures may comprise ferroelectric material. Each of the memory cell structures may be operated (i.e., read to/written from) by providing appropriate electrical stimulus to the gates through the drivers D0 . . . Dn, to the plates 68 through the drivers PL0 . . . PLn, and/or to one or both of the comparative bitlines BL-T and BL-C.

Figure 8:
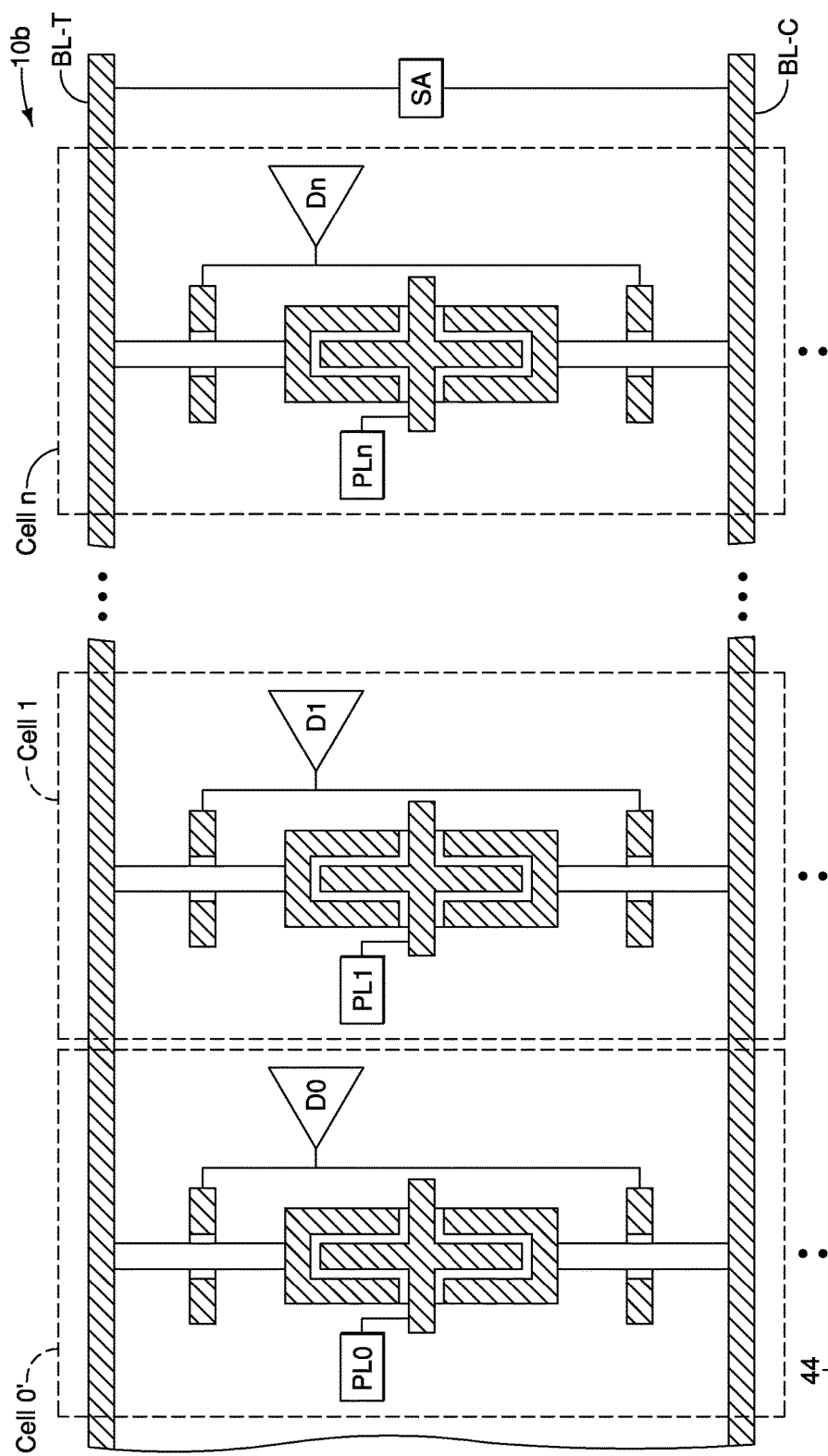
FIG. 8 is a diagrammatic cross-sectional view of an example arrangement of structures which may be utilized in the example apparatus of FIG. 7.

The architecture of FIG. 7 may be highly integrated in a manner analogous to that described above with reference to FIG. 4. For instance, FIG. 8 shows a region of the apparatus 10b comprising structures analogous those described above with reference to FIG. 4. The various regions of the transistors and capacitors of FIG. 8 are not labeled, but it is to be understood that such regions may be identical to analogous regions shown in the embodiment of FIG. 4.

Figure 9:
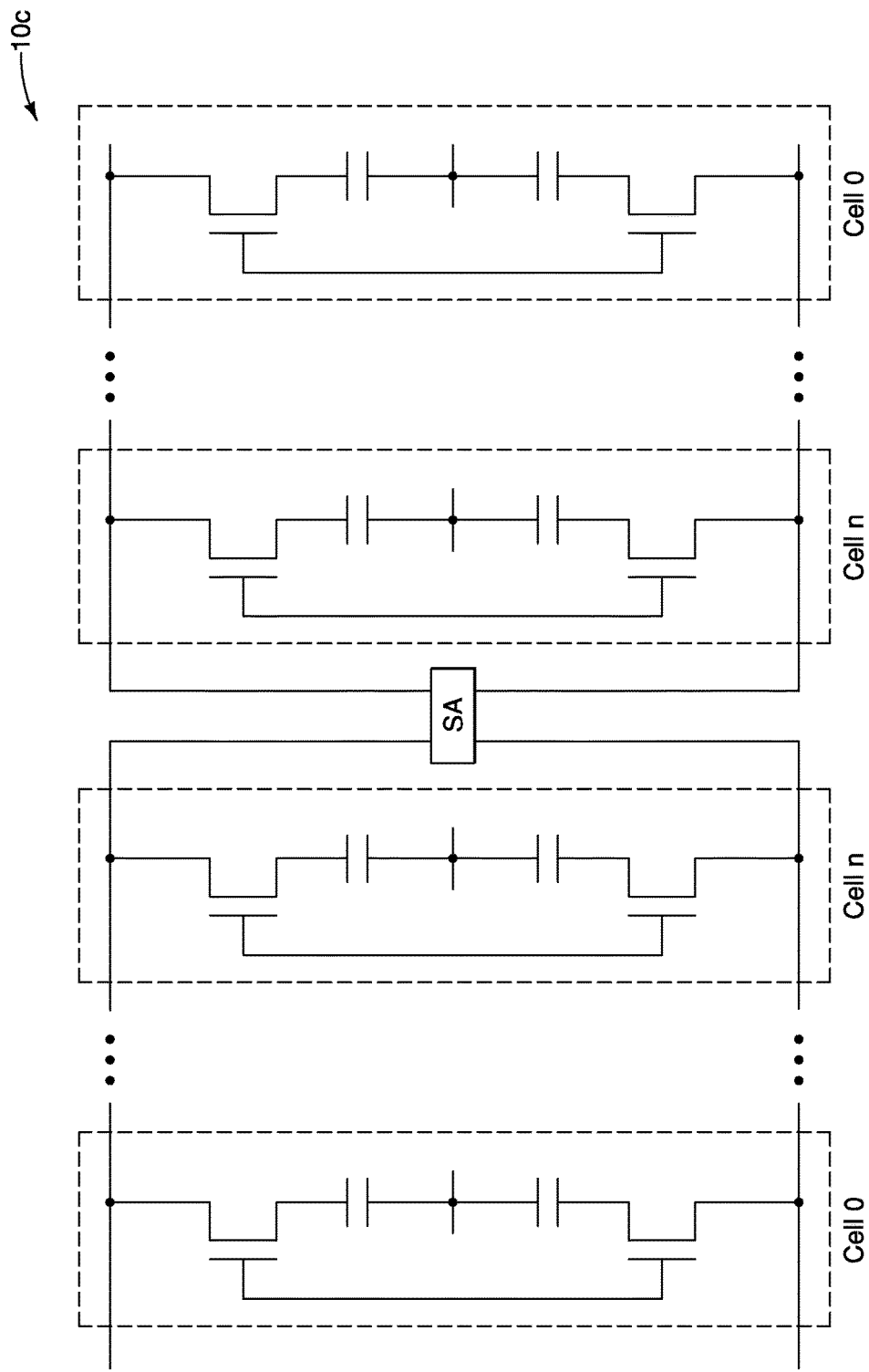
FIG. 9 is a schematic diagram of a region of an example apparatus.

In some embodiments, the 2T-2C memory configurations may be utilized in open arrangements somewhat analogous to the open arrangement described above with reference to FIG. 5. For instance, FIG. 9 shows an apparatus 10c having 2T-2C memory cell configurations provided in an open arrangement.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an apparatus having a first comparative bitline extending horizontally and which is coupled with a sense amplifier, and a second comparative bitline extending horizontally and which is coupled with the sense amplifier. First memory cell structures are coupled with the first comparative bitline. The first memory cell structures are horizontally spaced from one another and are together arranged in a first memory cell string. Each of the first memory cell structures has a first transistor associated with a first capacitor. The first transistors are proximate the first comparative bitline. Second memory cell structures are coupled with the second comparative bitline. The second memory cell structures are horizontally spaced from one another and are together arranged in a second memory cell string which is a complement to the first memory cell string. Each of the second memory cell structures has a second transistor associated with a second capacitor. The second transistors are proximate the second comparative bitline. Each of the first capacitors has a container-shaped first node and is vertically offset from an associated first sister capacitor which is a mirror image of its associated first capacitor along a horizontal plane between the first capacitor and the first sister capacitor. Each of the second capacitors has a container-shaped first node and is vertically offset from an associated second sister capacitor which is a mirror image of its associated second capacitor along a horizontal plane between the second capacitor and the second sister capacitor. The first memory cell string and its complement are configured to be compared through the sense amplifier.

Some embodiments include an apparatus having a first comparative bitline extending horizontally and which is coupled with a sense amplifier, and having a second comparative bitline under the first comparative bitline, extending horizontally, and which is coupled with the sense amplifier. A common plate is between the first and second comparative bitlines and extends horizontally. First memory cell structures are between the first comparative bitline and the common plate. The first memory cell structures are horizontally spaced from one another and are together arranged in a first memory cell string. Each of the first memory cell structures has a first transistor associated with a first capacitor. The first transistors are proximate the first comparative bitline. The first capacitors are proximate the common plate. Each of the first capacitors has a first node coupled with a source/drain region of its associated first transistor, and has a second node coupled with the common plate. Second memory cell structures are between the second comparative bitline and the common plate. The second memory cell structures are horizontally spaced from one another and are together arranged in a second memory cell string which is a complement to the first memory cell string. Each of the second memory cell structures has a second transistor associated with a second capacitor. The second transistors are proximate the second comparative bitline. The second capacitors are proximate the common plate. Each of the second capacitors has a first node coupled with a source/drain region of its associated second transistor, and has a second node coupled with the common plate. The first memory cell string and its complement are configured to be compared through the sense amplifier.

Some embodiments include an apparatus having a first comparative bitline extending horizontally and which is coupled with a first sense amplifier; having a second comparative bitline under the first comparative bitline, extending horizontally, and which is coupled with a second sense amplifier which is different from the first sense amplifier; having a third comparative bitline extending horizontally and which is coupled with the first sense amplifier; and having a fourth comparative bitline extending horizontally and which is coupled with the second sense amplifier. A common plate is between the first and second comparative bitlines and extends horizontally. First memory cell structures are between the first comparative bitline and the common plate. The first memory cell structures are horizontally spaced from one another and are together arranged in a first memory cell string. Each of the first memory cell structures has a first transistor associated with a first capacitor. The first transistors are proximate the first comparative bitline. The first capacitors are proximate the common plate. Each of the first capacitors has a first node coupled with a source/drain region of its associated first transistor, and has a second node coupled with the common plate. Second memory cell structures are between the second comparative bitline and the common plate. The second memory cell structures are horizontally spaced from one another and are together arranged in a second memory cell string. Each of the second memory cell structures has a second transistor associated with a second capacitor. The second transistors are proximate the second comparative bitline. The second capacitors are proximate the common plate. Each of the second capacitors has a first node coupled with a source/drain region of its associated second transistor, and has a second node coupled with the common plate. Third memory cell structures are along the third comparative bitline. The third memory cell structures are horizontally spaced from one another and are together arranged in a complement to the first memory cell string. The first memory cell string and its complement are configured to be compared to one another through the first sense amplifier. Fourth memory cell structures are along the fourth comparative bitline. The fourth memory cell structures are horizontally spaced from one another and are together being arranged in a complement to the second memory cell string. The second memory cell string and its complement are configured to be compared to one another through the second sense amplifier.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An apparatus comprising:
   a first bitline extending horizontally;
   a second bitline being offset vertically from the first bitline and extending horizontally in parallel to the first bitline;
   a common plate extending horizontally between the first and second bitlines;
   a plurality of first memory cell structures disposed horizontally between the first bitline and the common plate, each of the plurality of first memory cell structures including a first access device and a first capacitor coupled in series between the first bitline and the common plate;
   a plurality of second memory cell structures disposed horizontally between the second bitline and the common plate, each of the plurality of second memory cell structures including a second access device and a second capacitor coupled in series between the second bitline and the common plate;
   a first sense amplifier coupled to the first bitline;
   a second sense amplifier coupled to the second bitline;
   a third bitline extending horizontally;
   a plurality of third memory cell structures each coupled to the third bitline;
   a fourth bitline extending horizontally; and
   a plurality of fourth memory cell structures each coupled to the fourth bitline;
   wherein the first sense amplifier is further coupled to the third bitline to compare the first and third bitlines with each other; and
   wherein the second sense amplifier is further coupled to the fourth bitline to compare the third and fourth bitlines with each other.

* * * * *